(12) United States Patent
Efanov et al.

(10) Patent No.: US 10,211,816 B2
(45) Date of Patent: Feb. 19, 2019

(54) GENERATOR OF POWERFUL NANOSECOND PULSES (VARIANTS)

(71) Applicants: Mikhail Vladimirovich Efanov, St. Petersburg (RU); Arsenii Vadimovich Krasnov, St. Petersburg (RU); Sergey Valentinovich Zazulin, St. Petersburg (RU)

(72) Inventors: Mikhail Vladimirovich Efanov, St. Petersburg (RU); Arsenii Vadimovich Krasnov, St. Petersburg (RU); Sergey Valentinovich Zazulin, St. Petersburg (RU)

(*) Notice: Subject to any disclaimer, the term of this patent is extended or adjusted under 35 U.S.C. 154(b) by 11 days.

(21) Appl. No.: 15/528,513

(22) PCT Filed: Dec. 14, 2015

(86) PCT No.: PCT/RU2015/000875
§ 371 (c)(1),
(2) Date: Jun. 27, 2017

(87) PCT Pub. No.: WO2016/130044
PCT Pub. Date: Aug. 18, 2016

(65) Prior Publication Data
US 2017/0373672 A1 Dec. 28, 2017

(30) Foreign Application Priority Data
Feb. 11, 2015 (RU) .................... 2015104632

(51) Int. Cl.
*H03K 3/53* (2006.01)

(52) U.S. Cl.
CPC ..................... *H03K 3/53* (2013.01)

(58) Field of Classification Search
CPC ........................................... H03K 3/53
See application file for complete search history.

(56) References Cited

U.S. PATENT DOCUMENTS

| | | | | |
|---|---|---|---|---|
| 6,087,871 | A * | 7/2000 | Kardo-Syssoev | H03K 3/57 327/189 |
| 6,411,153 | B2 * | 6/2002 | Wittenbreder, Jr. | H02M 3/158 307/130 |
| 2007/0031959 | A1 * | 2/2007 | Kuthi | C12M 35/02 435/283.1 |
| 2007/0200436 | A1 * | 8/2007 | Barak | H03K 3/53 307/106 |

* cited by examiner

*Primary Examiner* — Daniel Kessie
(74) *Attorney, Agent, or Firm* — Inventa Capital PLC (57) ABSTRACT

A generator includes a series-connected inductive energy store and a superfast drift step recovery diode, as well as a load connected in parallel to the drift step recovery diode and switches. The switches are arranged in series, and the inductive energy storage device is connected to the point of connection of the switches therebetween and adjusting the amplitude of the pulses on the load by changing the closing and opening times of the switches. The moment of closing of the second switch is in the time interval between the opening of the first switch and changing of the polarity of the current through the inductive storage, wherein the time of its opening is in the interval of time from the beginning of the pulse formation on the load until the next closure of the first switch.

14 Claims, 6 Drawing Sheets

GENERATOR OF POWERFUL NANOSECOND PULSES (VARIANTS)

FIELD OF THE INVENTION

The invention relates to an impulse technology used as power supply for high power laser systems.

BACKGROUND OF THE INVENTION

One known generator of high-power nanosecond pulses includes a source of direct current, switches, an inductive energy storage, a breaker, an output bus as disclosed in Patent number RU No. 1487774, H03K 3/53, 1994. A disadvantage of the known device is low efficiency and low pulse repetition frequency.

Also known a semiconductor nanosecond pulse generator based on the superfast drift step recovery diode, which includes a direct current switch circuit, the load circuit, the reverse current switch circuit, the reverse current inductor as disclosed in Patent number RU No. 2009611, H03K 3/53, 1994. A disadvantage of the known device is the low efficiency and low pulse repetition frequency.

The closest in technical essence to claimed solution is a generator of high-power nanosecond pulses comprising series-connected inductive energy storage and superfast drift step recovery diode as well as load connected in parallel to drift diode, and switches as disclosed in Inventor's Certificate SU No. 1,804,271, H03K 3/53, 1996. A disadvantage of the known device is the low pulse repetition frequency (below 1 MHz) since in the process of pulse generation there is a complete discharge of the capacitors, which must be charged before the next pulse generation cycle, it limits the pulse repetition rate.

Disadvantages of the known device are low efficiency due to losses during charging capacitors; complicated circuit tuning procedure, since changing the transit time of a forward current through a drift diode is required to change the inductor chokes or capacitors.

SUMMARY OF THE INVENTION

The concept of the present invention has numerous industrial applications ranging from industrial pumps for circulating fluid to internal combustion engines. The technical goal of the claimed solution is to increase the efficiency in the formation of voltage pulses with high repetition frequency by reducing the preparation time before the next pulse generation cycle.

To achieve this technical result in the generator of high-power nanosecond pulses of a first embodiment, the generator includes a series-connected inductive energy storage and superfast drift step recovery diode and load connected in parallel to the drift diode and switches, the switches are arranged in series, and an inductive energy storage device is connected to the connection point with the possibility of adjusting the pulse amplitude at the load circuit by changing the closing and opening time of the switch, the closing time of the second switch is in the interval of time between the opening of the first switch and the time then current polarity through the inductive storage changed, and the time of its opening is located in the time interval from the start of the pulse formation on the load to the next closure of the first switch, also there are two dc voltage source with different polarity, and each switch is connected to one of the sources.

Also, according to the invention of the first embodiment, the first switch is connected to a positive polarity voltage source, the second switch is connected to a negative polarity voltage source, and the cathode of the drift diode connected to a common busbar.

Also, according to the invention of the first embodiment, the first switch is connected to a negative polarity voltage source, the second switch is connected to a positive polarity voltage source, and the anode of the drift diode connected to a common busbar.

Also, according to the invention of the first embodiment, the generator additionally comprises a chain of series-connected choke and resistor connected in parallel to drift diode and load is connected to the drift diode through a blocking capacitor.

To achieve this technical result in the generator of high-power nanosecond pulses of a second embodiment, this generator includes a series-connected inductive energy storage and superfast drift step recovery diode and load connected in parallel to a drift diode and switches. The switches are arranged in series and an inductive energy storage device is connected to their connection point with the possibility of adjusting the pulse amplitude at the load circuit by adjusting the pulse amplitude of the load circuit by changing the closing and opening time of the switch. The closing time of the second switch is in the interval of time between the opening of the first switch and the time then current polarity through the inductive storage changed and the time of its opening is located in the time interval from the start of the pulse formation on the load to the next closure of the first switch. There are two dc voltage source with same polarity and one of them is connected with the first switch and the second source with a smaller amplitude is connected to the drift diode. The second switch is connected to the common bus and the load is connected to the drift diode via a separating diode.

Also according to the invention of the second embodiment, the voltage source has a positive polarity, the cathode of the drift diode is connected to a voltage source. According to the invention of the second embodiment, the DC voltage sources have a negative polarity, the anode of drift diode is connected to voltage source.

BRIEF DESCRIPTION OF THE DRAWINGS

Other advantages of the present invention will be readily appreciated as the same becomes better understood by reference to the following detailed description when considered in connection with the accompanying drawings wherein.

The following notation is used in the drawings wherein the first switch is shown at 1, the second switch is shown at 2, DC voltage source shown at 3 and 4, the inductive energy storage is shown at 5, the drift diode is shown at 6, the choke is shown at 7, the resistor is shown at 8, the blocking capacitor is shown at 9, the isolating diode is shown at 10, and the load is shown at H.

DETAILED DESCRIPTION OF THE INVENTION

Figure 1:
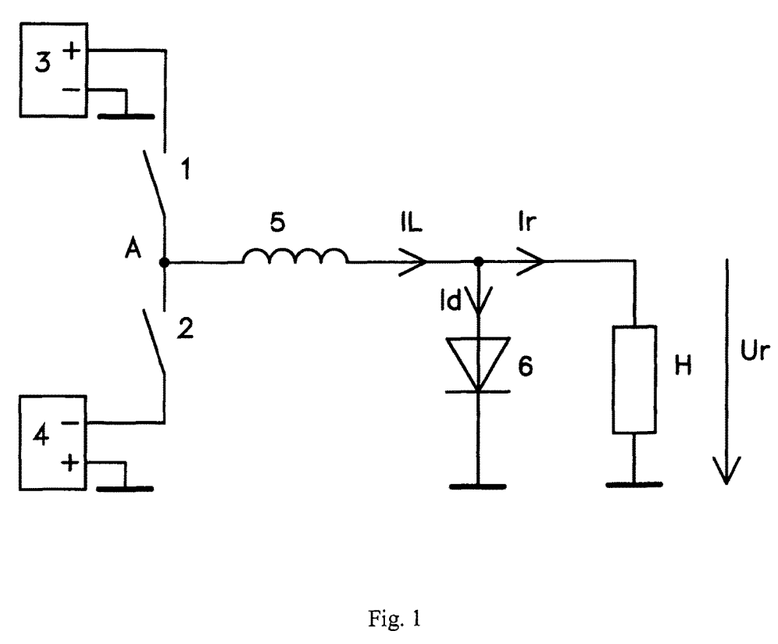
FIG. 1 shows the functional block diagram of the generator of high-power nanosecond pulses of the first embodiment.

The concept of the present invention has numerous industrial applications ranging from industrial pumps for circulating fluid to internal combustion engines. The generator of high-power nanosecond pulses of the first embodiment includes series-connected switches 1 and 2, each connected to a DC voltage source, i.e, the switch 1 is connected to a voltage source 3, and the switch 2—to a voltage source 4, as shown in FIG. 1.

The DC voltage sources 3 and 4 are both connected to a common bus. The switches 1 and 2 are semiconductor devices, so there is some capacity between their electrodes. The device also presents an inductive energy storage device 5, which is connected to point A between the switches 1 and 2 and connected in series with the load H. The device also includes a superfast drift step recovery diode (breaker) 6, which is connected between the inductive energy storage device 5, and the common bus of the DC voltage sources 3 and 4, wherein the cathode of drift diode 6 is connected to the common bus. When the load H in parallel with the drift diode 6 between the output of the drift diode 6 and the common bus of the DC voltage source 3 and 4.

Figure 3:
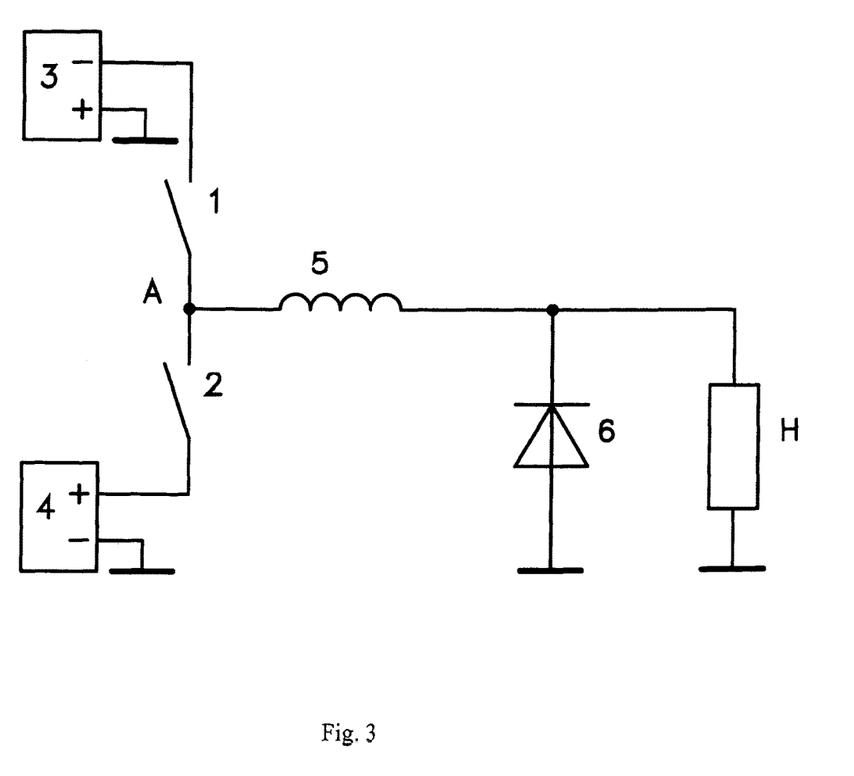
FIG. 3 shows the circuit of the generator of high-power nanosecond pulses of the first embodiment.

The generator circuit shown in FIG. 3 differs in polarity of the DC voltage sources 3 and 4 and position of the drift diode 6. In this circuit, the switch 1 is connected to a DC voltage source of negative polarity 3, and the switch 2 to a DC voltage source of a positive polarity 4, the anode of drift diode 6 is connected to common bus.

Figure 4:
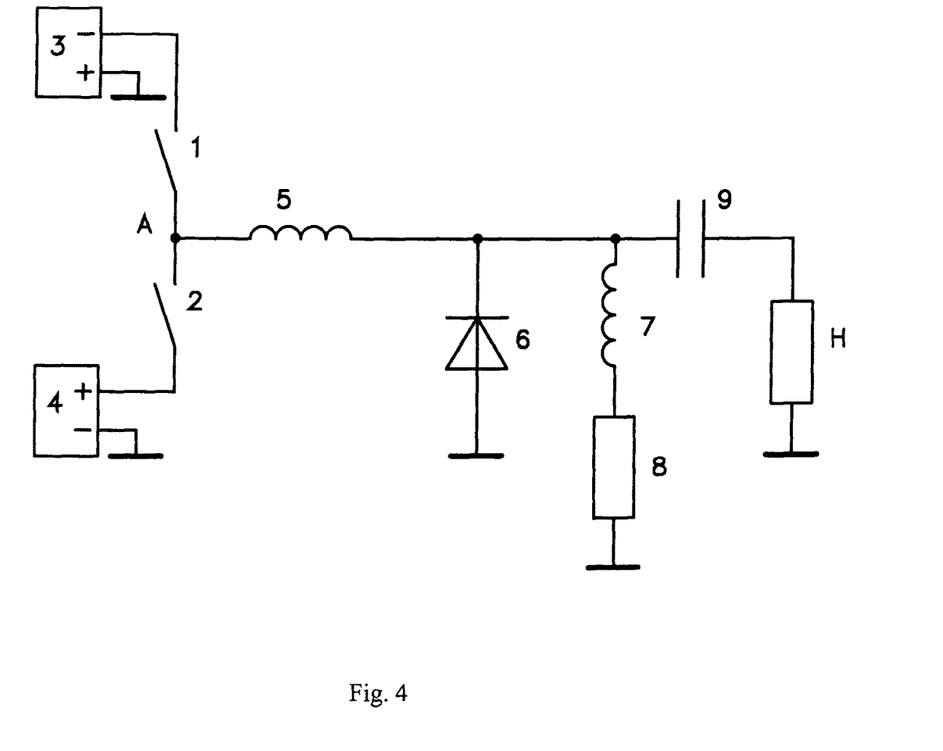
FIG. 4 shows a schematic diagram of a generator with DC isolation in the load circuit of the first embodiment.

FIG. 4 is a diagram of the generator with DC isolation with load circuit H. In parallel to the drift diode 6, connected a circuit of the series-connected choke 7 and the resistor 8. The load H is connected to the drift diode 6 via a blocking capacitor 9.

The capacitor 9 is designed to block the flow of low-frequency currents to the load H, which may be necessary in the case of a generator operating on an antenna, an adder and another load having a high reflectance at a low frequency. The choke 7 and the resistor 8 are necessary for the discharge of the interelectrode capacitances of the open switches 1 and 2.

The generator of high-power nanosecond pulses of the first embodiment operates as follows. Initially, the switches 1 and 2 are open. At time t=0 the switch 1 closes, a voltage equal to the value UL=U1−Vd is applied to the inductive storage 5, where U1 is the voltage of the source 3; Vd—the voltage drop across the drift diode 6. The current through the inductive storage 5, shown at A in FIG. 2, increases linearly with the slew rate dIL/dt=(U1−Vd)/ L, where L—inductance of the inductive storage 5.

Figure 2:
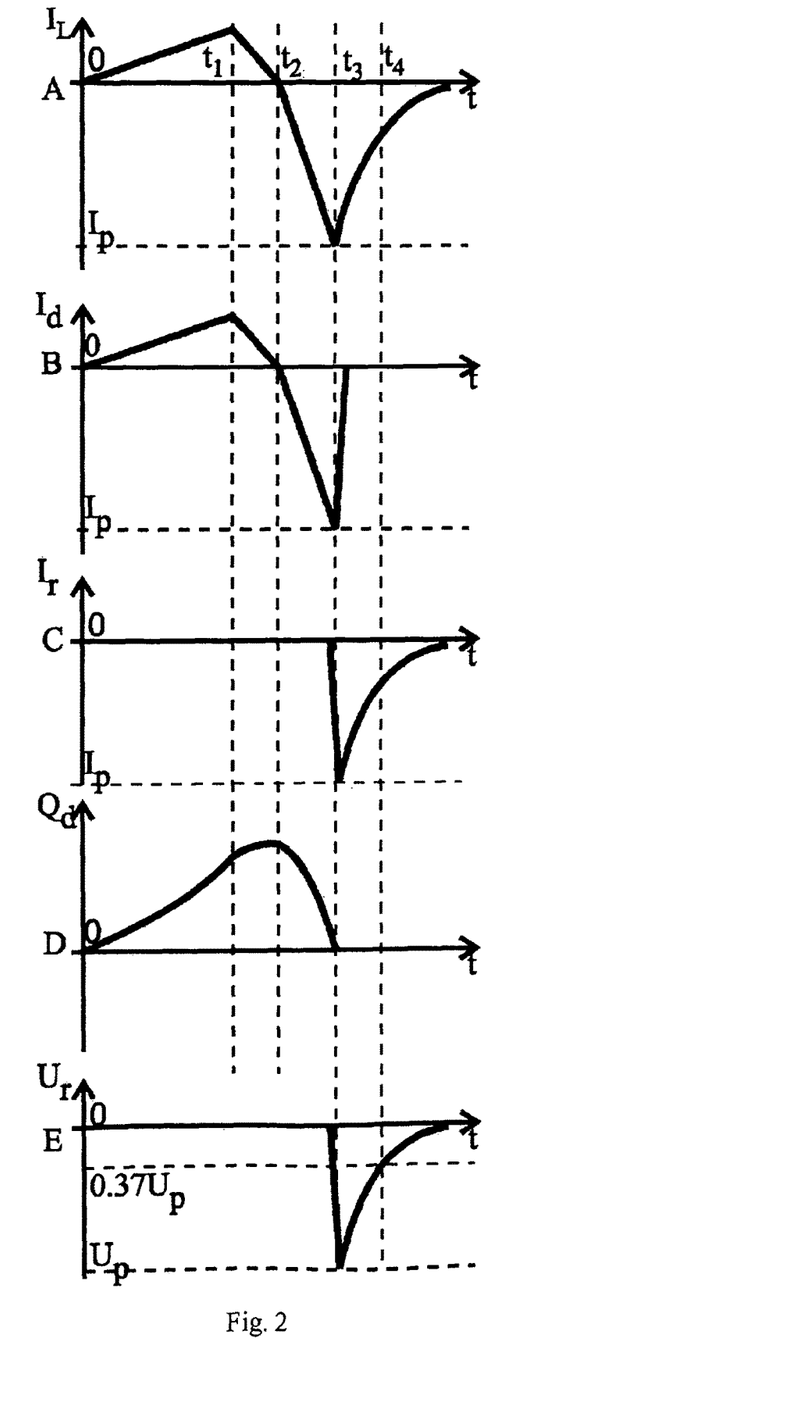
FIG. 2 shows the time graphs of currents, charges and voltages in the circuit, wherein the time dependence of the current through the inductive storage is presented at A, the time dependence of the current through the drift diode is presented at B, the time dependence of the current through the load is presented at C, the time dependence of the charge accumulated in the drift diode is presented at D, and time dependence of the voltage across the load is presented at E.

The main part of the current IL through the inductive storage 5 passes through the drift diode 6, since the resistance of the drift diode 6 is much smaller than the resistance of load H, namely Id≈IL, where Id—the current through the drift diode 6, shown at B in FIG. 2.

At time t=t1 the switch 1 opens. The current through the inductive storage 5 starts to decrease. The current flowing through the interelectrode capacitance switches 1 and 2. At time t=t2 the switch 2 closes.

In this case, the switch 2 is closed no earlier than the opening of the switch 1 and until the current polarity changes through the inductive energy store 5. The voltage UL=−U2+Vd is applied to the inductive storage 5, where U2 is the voltage of voltage source 4. The current through the inductive storage 5 decreases linearly at a rate dIL/dt=(−U2+Vd)/L, shown at A in FIG. 2.

The current through the inductive storage 5 flows through the drift diode 6 till the time t3. At this moment, the drift diode 6 is recovering, i.e, the recovery occurs when the charge Qd that has passed through the drift diode 6 becomes zero, namely Qd=∫Id*dt=0, with t=0 . . t3, shown at D in FIG. 2. After time t3, the current through the inductive storage 5 flows through the load H, namely Ir≈IL, when t>t3, where Ir−H current through the load, shown at C in FIG. 2.

At the load H, occurs the voltage Up=Ip*R, where Ip—peak value of the current through the diode 6 at the time of reverse recovery; R−H load impedance, shown at E in FIG. 2. The front edge of the voltage across the load H is determined by the capacitance Cd of the drift diode 6, the trailing edge is determined by the inductance L of the inductive storage 5 and the load resistance R. The voltage reaches a value of 0.37*Up at time t4=t3+tLR, where tLR=L/R is a time constant. The opening of the switch 2 occurs not earlier than the beginning of the formation of a high-voltage pulse at the load H.

Since there are no capacitors that need to be charged between pulses, it is possible to achieve a high repetition rate of pulses. The repetition frequency is limited only by the parameters of the drift diode 6 and switches 1 and 2, it is possible to adjust the pulse parameters over a wide range by changing the voltages U1, U2 and the times t1, t2.

As the semiconductor switches 1 and 2, bipolar transistors, field effect transistors, insulated gate bipolar transistors, thyristors and other electronic switches can be used. Here is an example of the generator of nanosecond voltage pulses of the first embodiment with an amplitude Up=−475 V at the load resistance R=12,5 ohms. Voltages of the sources 3 and 4 are chosen equal to U3=10 V, U4=65 V. The times of opening of the switch 1 (t1) and closing of the switch 2 (t2) are respectively t1=5 ns and t2=5.5 ns. The inductance of the inductive energy storage 5 is chosen equal to L=1.5 nH. The voltage drop across the drift diode 6 is a Vd=7 V.

When the switch 1 is closed, the current through the inductive energy store 5 increases linearly with the rate according to the expression: dIL/dt=(U1−Vd)/L=(10 V−7 V)/1,5 nH=2 A/ns. At the time t1, the current through the inductive energy storage 5 and through the drift diode 6 reaches the value: IL=Id=dIL/dt*t1=2 A/ns*5 ns=10 A. At time t1, switch 1 is opened. The current through the inductive energy store 5 drops to 0 in 0.5 ns. The current decay time is determined by the interelectrode capacitances of the switches 1 and 2.

At the time t2, the switch 2 is closed. The current through the inductive energy store 5 decreases linearly with the speed according to the expression: dIL/dt=(2+Vd)/L=(−65 V+7 V)/1.5 nH=−38 A/ns. At the time t3=6.5 ns, the charge Qd passing through the drift diode 6 is equal to 0 and the drift diode 6 is recovering. At this moment, the current through the inductive energy storage device 5 and the drift diode 6 reaches the value Ip=dIL/d(t*t3−t2)=−38 A/ns* (6.5 ns−5.5 ns)=−38 A.

After the recovery of the drift diode 6 current flows through the load H and produces a voltage on the load with an amplitude Up=Ip*R=−38 A* 12,5 ohms=−475 V. The voltage at the load H reaches a value of 0.37*Up=175.8 V at time t4=t3+L/R=6.5 ns+1.5 nH/12.5 ohm=6.62 ns. After the time t4, the switch 2 is opened and the generator is ready for the next cycle of pulse generation. Thus, the maximum pulse repetition rate is fmax=1/t4=1/6.62 ns=151 MHz.

Figure 5:
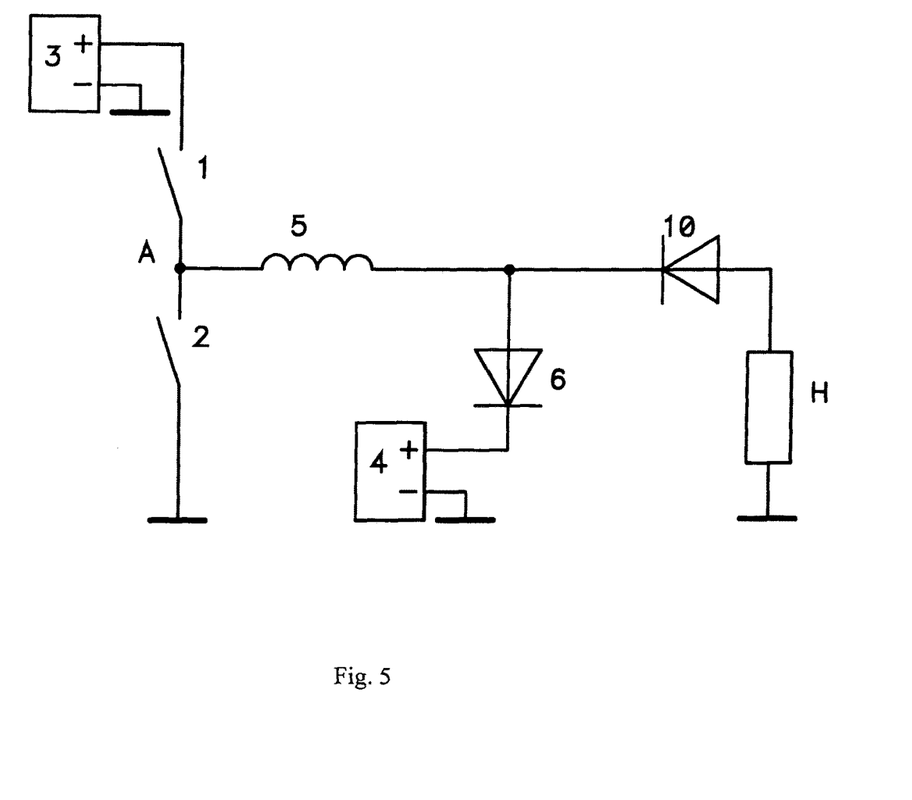
FIG. 5 shows the functional block diagram of the generator of high-power nanosecond pulses of the second embodiment.

Thus, the device makes it possible to generate voltage pulses with a high repetition rate, much higher than the repetition frequency of the prototype pulses. The generator of high-power nanosecond pulse of the second embodiment includes switches 1 and 2 connected in series, the switch 1 connected to the voltage source 3, and the switch 2 connected to a common bus, as shown in FIG. 5.

The voltage source 4 in this variant of the invention has the same polarity as the source 3. The device also comprises an inductive energy store 5 connected to the point A between switches 1 and 2 and connected in series to the load H. The device also includes a superfast drift step recovery diode (breaker) 6 connected between the inductive storage 5 and the voltage source 4. FIG. 5 is a schematic diagram of a generator where sources of direct voltage 3 and 4 have positive polarity, while the cathode of drift diode 6 is connected to the source of direct voltage 4.

Figure 6:
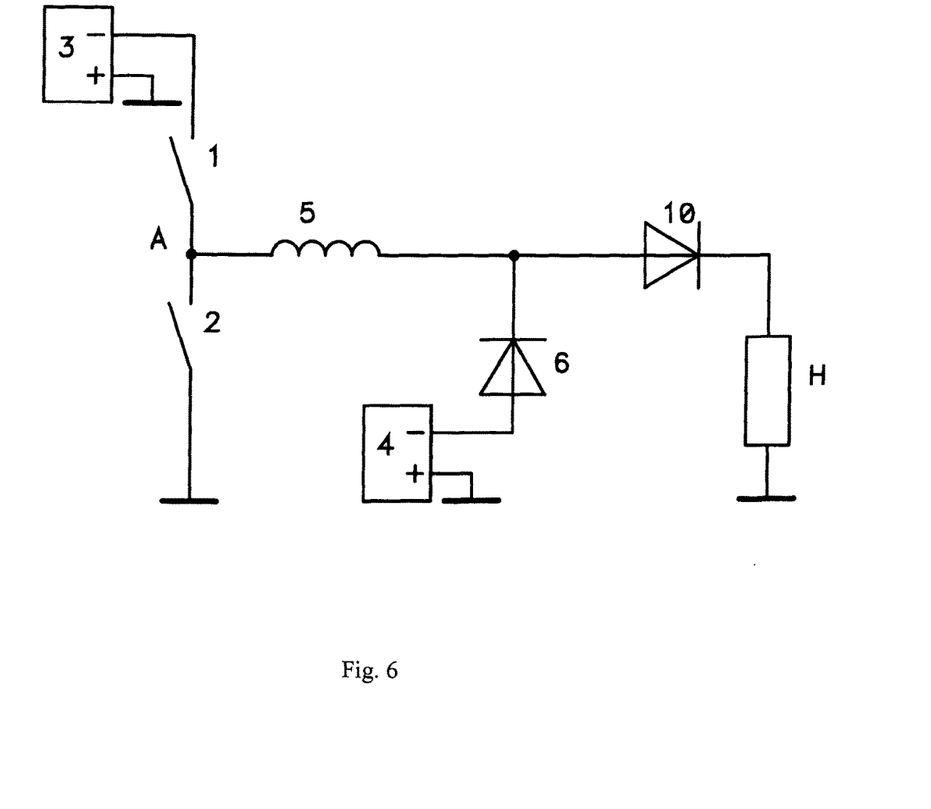
FIG. 6 shows the functional block diagram of the generator of high-power nanosecond pulses of the second embodiment.

The inductive energy store 5 is connected to the load H via the separating diode 10, which is connected between the anode of the separating diode 10 and the common bus. The generator circuit shown in FIG. 6 differs by the polarity of the voltage sources 3 and 4 and by position of the drift diode 6. In this circuit, the switch 1 is connected to a voltage source with the negative polarity 3, and the anode of the drift diode 6 is connected to a voltage source with the negative polarity 4.

The generator of high-power nanosecond pulses, according to the second embodiment of the present invention, works in the same way as the generator according to the first embodiment of the present invention. The difference in operation of the generator according to the second embodiment from the operation of the generator according to the first embodiment is as follows: 1. During the forward current flow through the drift diode 6 in the period from t=0 to t2 at the anode of the drift diode 6, the voltage is Ud=U2+Vd relative to the common bus, and during the period of the reverse current from t2 to t3, Ud=U2−Vd. From the load H this voltage is blocked by the separation diode 10. 2. After the recovery of the drift diode 6, the voltage at the load H begins to increase after the voltage at the anode of the drift diode 6 exceeds the value U2 (the separation diode 10 opens) and amounts to UH=Vd−U2.

INDUSTRIAL APPLICABILITY

The claimed device allows to regulate the passage time of forward and reverse currents through the drift diode by changing the closing and opening times of the keys. At the same time, an increase in the time of passage of a direct current through an inductive energy storage device with constant voltages of sources of constant voltage leads to an increase in the amplitude of the voltage on the load.

The device makes it possible to use any inductive elements as an inductive storage, without the need for coordination in their operation. There are no charging circuits in the device, which leads to a shortening of the preparation time to the beginning of the next cycle of pulse generation, and therefore, to an increase in the efficiency.

The high-power nanosecond pulse generator of the second embodiment allows using sources of constant voltage of one polarity, i.e. only one main source can be used, and not two, since the consumption of the power supply of the drift diode is determined only by the losses in the diode itself and constitutes a small fraction of the total consumption.

The advantage of this option is also that it is possible to work with one pulse driver for both switches, since the time of opening the second switch can be combined with the moment of closing the first switch of the next cycle.

What is claimed is:

1. A generator of high-power nanosecond pulses comprising:
    a series of connected inductive energy storage devices and a superfast drift step recovery diode, and a load connected in parallel to the drift step recovery diode and switches arranged in series,
    an inductive energy storage device adaptable for adjusting the amplitude of the pulses on the load by changing closing and opening times of the switches, the moment of closing the second switch in the time interval between the opening of the first switch and change of the polarity of the current through the inductive storage, and the time of its opening is in the time interval from the beginning of the pulse formation on the load to the moment of the next closure of the first switch, presenting two sources of voltage with different polarity wherein each switch is connected to one of the sources.

2. The generator as set forth in claim 1, wherein the first switch is connected to a source of voltage with a positive polarity.

3. The generator as set forth in claim 1, wherein the second switch is connected to a voltage source with the negative polarity.

4. The generator as set forth in claim 2, wherein the cathode of the drift step recovery diode is connected to the common cathode bus.

5. The generator as set forth in claim 1, wherein the first switch is connected to a voltage source with the negative polarity.

6. The generator as set forth in claim 1, wherein the second switch is connected to a voltage source with the positive polarity.

7. The generator as set forth in claim 6, wherein the drift diode is connected to the common busbar by the anode.

8. The generator as set forth in claim 1, including a chain of series-connected choke and a resistor connected in parallel with the drift step recovery diode.

9. The generator as set forth in claim 8, wherein the load is connected to the drift step recovery diode through a blocking capacitor.

10. A generator of high-power nanosecond pulses comprising:
    at least one inductive energy storage device connected in series and a superfast drift step recovery diode, as well as a load connected in parallel to the drift step recovery diode and switches, characterized in that the switches are arranged in series, an inductive energy storage device with the possibility of adjusting the pulse amplitude of the load circuit by varying the time and opening switch, the moment the second switch circuit presented in the time interval between the opening of the first switch and the instant of change of the polarity of the current through the inductive storage device, and the time of its opening is in the time interval from the beginning of the pulse formation on the load to the moment of the next closing of the first switch, two constant voltage sources of the same polarity are inputted, wherein one of them is connected to the first switch and a second source with a smaller amplitude than the first source is connected to the drift diode, whereby the second switch is connected to the common bus and the load is connected to the diode through the drift spacer diode.

11. The generator as set forth in claim 10, wherein the sources of direct voltage has a positive polarity.

12. The generator as set forth in claim 11, wherein the drift step recovery diode is connected to a source of constant voltage by a cathode.

13. The generator as set forth in claim 12, wherein the voltage sources has a negative polarity.

14. The generator as set forth in claim 13, wherein the drift step recovery diode is connected to a constant voltage source by an anode.

* * * * *